United States Patent [19]

Fukuyama

[11] Patent Number: 5,559,475
[45] Date of Patent: Sep. 24, 1996

[54] FREQUENCY SYNTHESIZER FOR SYNTHESIZING SIGNALS OF A VARIETY OF FREQUENCIES BY CROSS MODULATION

[75] Inventor: Shinjiro Fukuyama, Amagasaki, Japan

[73] Assignee: Mitsubishi Denki Kabushiki Kaisha, Tokyo, Japan

[21] Appl. No.: 404,624

[22] Filed: Mar. 14, 1995

[30]  Foreign Application Priority Data

Mar. 16, 1994 [JP] Japan .................... 6-046104

[51] Int. Cl.$^6$ .................... H03L 7/18; H04L 27/20
[52] U.S. Cl. .................... 331/31; 331/38; 332/103; 375/279; 375/308
[58] Field of Search .................... 331/30, 31, 38; 332/103, 104, 105; 375/261, 279, 298, 308; 327/105, 106

[56]  References Cited

U.S. PATENT DOCUMENTS 4,339,826  7/1982  Ogita et al. .................... 331/31
4,558,282  12/1985  Lowenschuss .................... 327/105
4,654,597  3/1987  Hino .................... 327/106
5,412,351  5/1995  Nystrom et al. .................... 332/105
5,451,910  9/1995  Guthrie .................... 327/105

FOREIGN PATENT DOCUMENTS 4-165820  6/1992  Japan .

OTHER PUBLICATIONS

"Application Technique of PLL", Electronic Circuit Know-How Series, Nippon Hoso Shuppan Kyokai, pp. 59–60, Jan. 20, 1988.

Primary Examiner—Siegfried H. Grimm
Attorney, Agent, or Firm—Rothwell, Figg, Ernst & Kurz

[57]  ABSTRACT

A frequency synthesizer in which a PLL synthesizer 50 generates signals of frequency steps of an integer times a target frequency step. A base band generator 2 digitally generates sine wave signal components of the target frequency step. The outputs from the PLL synthesizer 50 and the base band generator 2 are cross-modulated by use of a quadrature modulator 1 to change the frequency of the output signals with a change step of the base band generator 2.

7 Claims, 6 Drawing Sheets

FREQUENCY SYNTHESIZER FOR SYNTHESIZING SIGNALS OF A VARIETY OF FREQUENCIES BY CROSS MODULATION

BACKGROUND OF THE INVENTION

1. Field of the Invention

The present invention relates to a frequency synthesizer, which is capable of outputting signals of a variety of frequencies, to be used for a local oscillator of a transmitter or the like.

2. Description of the Related Art

Figure 8:
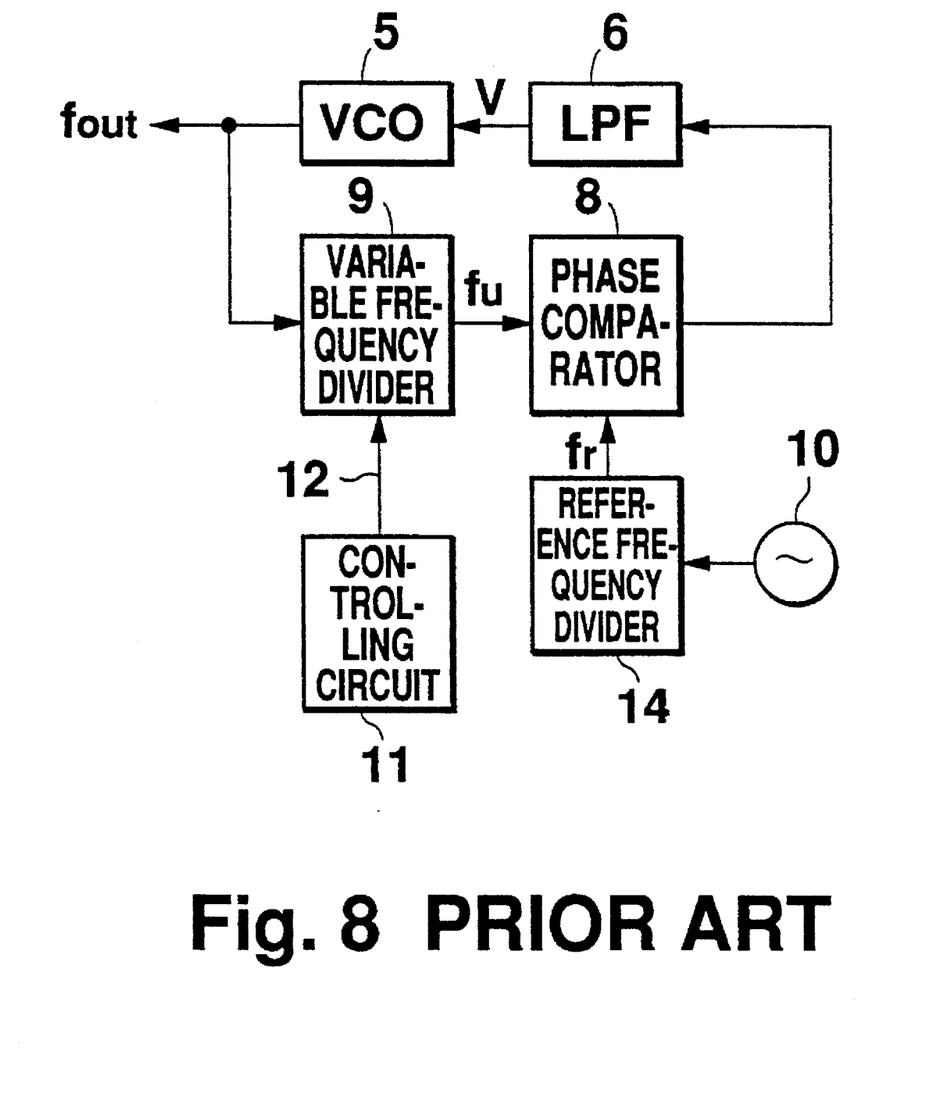
FIG. 8 is a block diagram showing a conventional frequency synthesizer.

Heretofore a frequency synthesizer, capable of changing a frequency of an output signal with a predetermined step, has been used for a local oscillator of a transmitter such as a cellular phone. FIG. 8 exemplifies a composition of a conventional PLL (Phase Locked Loop) frequency synthesizer described in "Easy Application Technique of PLL" (Electronic Circuit Know-How, Nippon Hoso Shuppan Association pp. 59), for example.

In FIG. 8, the numerals designate respectively: 10, a reference oscillator; 14, a reference frequency divider; 5, a voltage controlled oscillator; 9, a variable frequency divider; 8, a phase comparator; 6, a loop filter; 11, a controlling circuit for determining a frequency dividing ratio of the variable frequency divider 9; and 12, frequency dividing data from the controlling circuit 11.

In operation, the output from the reference oscillator 10 is divided by the reference frequency divider 14 to generate signals of a reference frequency fr. On the other hand, the output from the voltage controlling oscillator 5 for providing signals of a target frequency fout is divided by the variable frequency divider 9 with a frequency dividing ratio N (N: a positive integer) determined by the controlling circuit 11 so as to be supplied to the phase comparator 8 as a variable frequency divided signal of the frequency fu.

The phase comparator 8 compares the phases of the reference frequency signal and the variable frequency dividing signal to generate a phase comparing signal in accordance with the phase difference between them and to supply it to the loop filter 6. The loop filter 6 extracts the low-band component of the phase comparing signal to generate a frequency controlling voltage V in order to vary the oscillating frequency of the voltage controlling oscillator 5. Accordingly, with such a composition, it is possible to compose a PLL synthesizer in which the phase of the variable frequency divided signal follows that of the reference frequency signal.

Namely, the operation of the PLL synthesizer continues until any phase difference output of delay or advance of the phase comparator 8 disappears and takes a synchronous state when the phase difference becomes zero. At this time, the condition of a relationship of an output frequency fout=N*fr is satisfied, so that it is possible to provide an output of a frequency with the reference frequency as the variation step by varying the frequency dividing ratio N.

In the conventional PLL frequency synthesizer, the phase comparator 8 detects the phase difference of the frequency fr from the reference frequency signal. As a result, the output of the phase comparator 8 contains a frequency component of the reference frequency fr. The PLL synthesizer then needs to set a cut-off frequency of the loop filter 6 to be sufficiently lower than fr in order to eliminate the component of the frequency fr. Setting the cut-off frequency of the loop filter 6 to be lower than fr means, however, that the signals of a frequency higher than that are eliminated so as to restrict the varying speed of the frequency controlling voltage V to fr. Therefore, there has been a disadvantage that it takes too long to synchronize to the target frequency in the case of varying the frequency dividing ratio N in the variable frequency divider 9.

SUMMARY OF THE INVENTION

It is therefore an object of this invention to provide a frequency synthesizer which is capable of quickly synchronizing to a target frequency by varying an output frequency using signals which have been digitally generated.

A first aspect of this invention features to output a signal that has been shifted from a frequency of a signal generated by a signal generating means, by a frequency of a shifting signal that has been produced by quadrature modulation of two signals generated by a signal generating means with phases different from each other by 90 degrees and two shifting signals that have been digitally generated by a base band generator with phases different from each other by 90 degrees.

According to this invention, since a shifting signal is digitally generated by the base band generator, it is possible to quickly perform the change of the frequency. This means, for example, to quickly make the channel change in a radio communication such as cellular phone, so as to minimize the communication-stop time at the time of channel change. In particular, if the frequency of the signal generated by the signal generating means is set to be constant, the channel changing operation can be completed instantaneously.

A second aspect of this invention features to generate signals of a constant frequency by a signal generating means.

A third aspect of this invention features to generate a shifting signal changing with a predetermined changing step by a PLL synthesizer. Further, it features that the shifting signal of the base band frequency reads out digital data showing a predetermined wave form from a memory so as to be then converted into analog data.

According to this invention, if the varying step of the shifting signal generated by the base band generator is reduced and the varying step of the PLL frequency synthesizer is increased, the reference frequency of the PLL frequency synthesizer will be increased. Therefore, the cut-off frequency of the filter can be enhanced to speed-up the response speed of the PLL loop. On the other hand, the base band generator for digitally generating a sine-wave signal has a substantially zero changing time of the output frequency, so that it is possible to provide a frequency synthesizer synchronizing with a target frequency at a high speed. Further, it is possible to readily vary the output frequency over a wide range.

The present invention further features to change the polarity of the cross modulator.

Thus, it is possible to add or subtract signals from the base band generator in the cross modulator, so as to vary the output signal within a two times larger range than that of the signal generated by the base band generator.

In addition, the base band generator according to this invention outputs a shifting signal that has been phase-modulated in accordance with the phase modulating data.

As mentioned above, the data for the phase modulation and the sine wave component of each output frequency step are synthesized in the base band generator. As a result, the output signal will become already modulated by the data, so that the transmitter itself can be composed simply.

Further, according to this invention, the phase modulation is carried out by reading out phase modulating data from the memory in accordance with the phase modulating command, and cross-modulating the thus read out data by a phase shifting signal.

The frequency for synthesizing the output of the PLL frequency synthesizer and the output of the base band generator can be either a sum or a difference of the original frequencies, so that the sampling frequency of the base band generator can be reduced.

DETAILED DESCRIPTION OF THE PREFERRED EMBODIMENTS

First Embodiment

Figure 1:
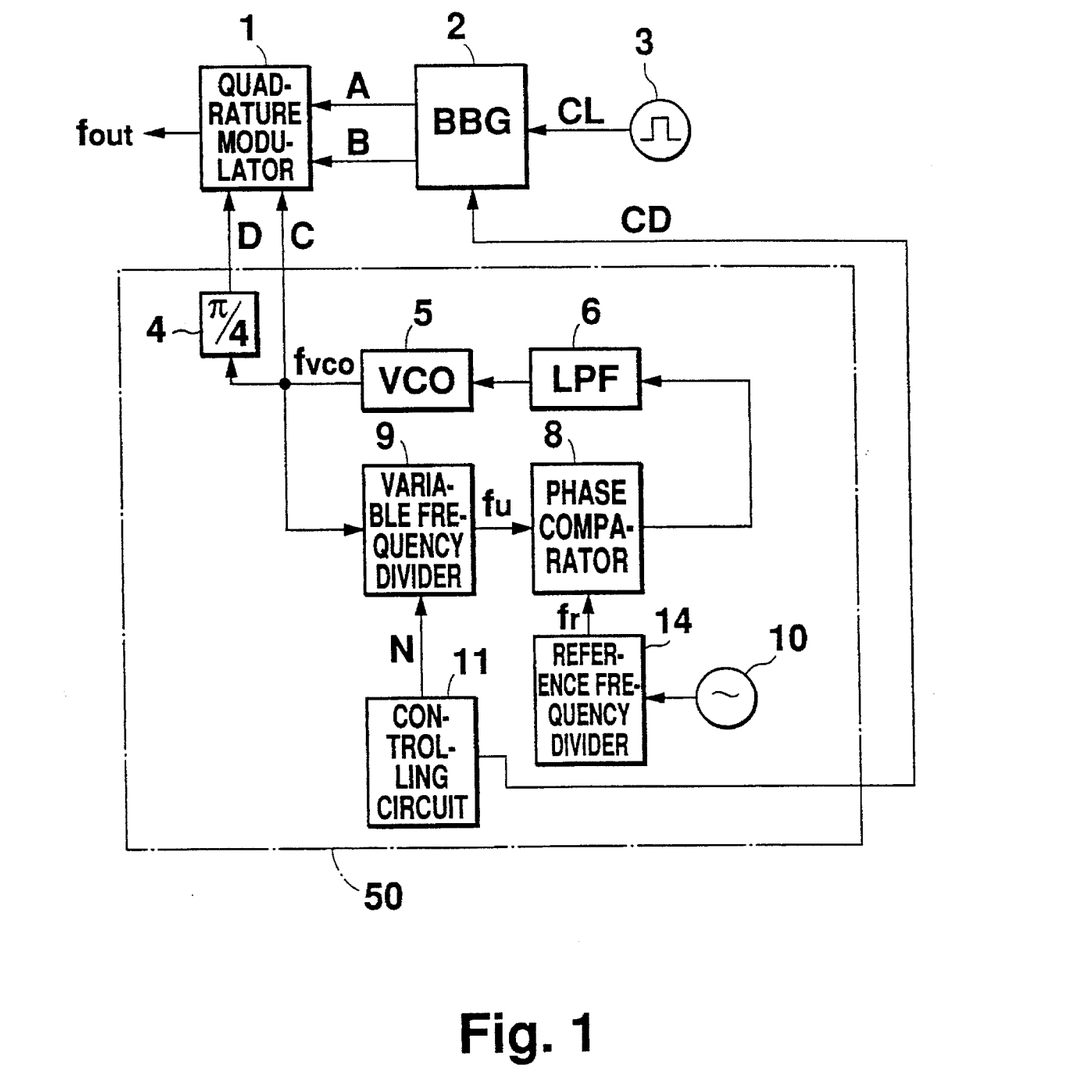
FIG. 1 is a block diagram showing a frequency synthesizer according to a first embodiment of this invention.

FIG. 1 shows a composition of a first embodiment of this invention. In FIG. 1, the numerals designate respectively: 1, a cross modulator; 2, a base band generator; 3, a clock generator for determining operational timing of the base band generator 2 by supplying clocks CL to the base band generator 2, which then outputs two shifting signals A and B with a mutual phase difference by 90 degrees.

Further, the numerals designate respectively: 10, a reference oscillator; 14, a reference frequency divider; 5, a voltage controlled oscillator; 4, a phase shifter for shifting the phase of the output from the voltage controlled oscillator 5 by 90 degrees; 9, a variable frequency divider; 8, a phase comparator; 6, a loop filter; 11, a controlling circuit for determining a frequency dividing ratio of the variable frequency divider 9; N, a frequency dividing numerical data from the controlling circuit 11. There is composed a PLL synthesizer 50 for synchronizing a variable frequency dividing signal fu being an output from the variable frequency divider 9 with a reference frequency signal fr being an output of the reference frequency divider 14.

Figure 2:
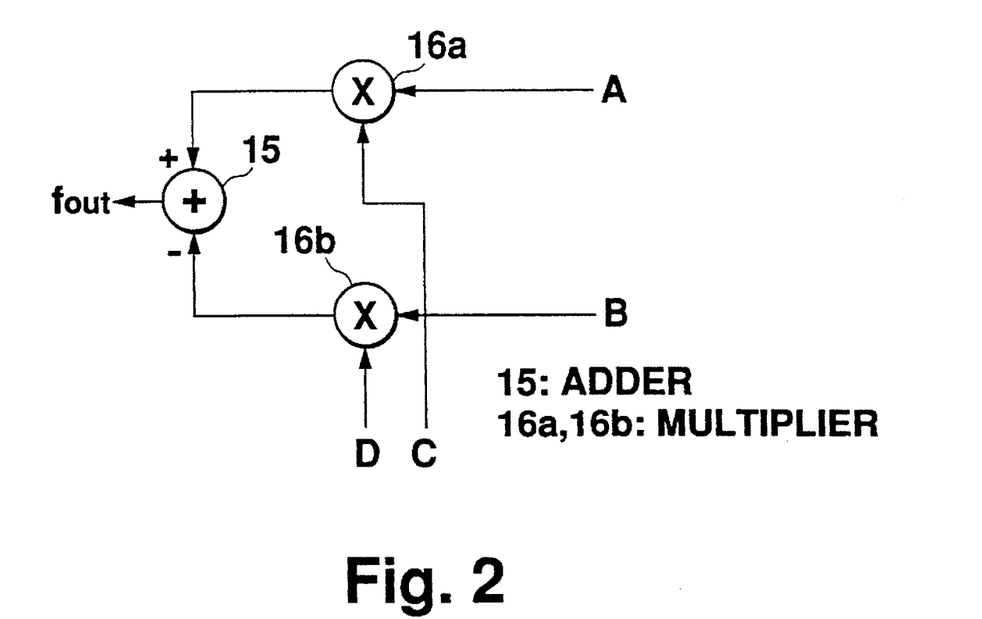
FIG. 2 is a block diagram showing a composition of a cross modulator.

FIG. 2 is a compositional example of the quadrature modulator 1. In FIG. 2, the numerals designate respectively: 15, an adder; 16a and 16b, multipliers. The multiplier 16a multiplies two input signals A and C, while the multiplier 16b multiplies two input signals B and D, the outputs from these multipliers 16a and 16b are added in the adder 15 (in this case, the output of the multiplier 16b is subtracted from that of the multiplier 16a). The input signals C and D are different in phase from each other by 90 degrees for performing the quadrature modulation.

Figure 3:
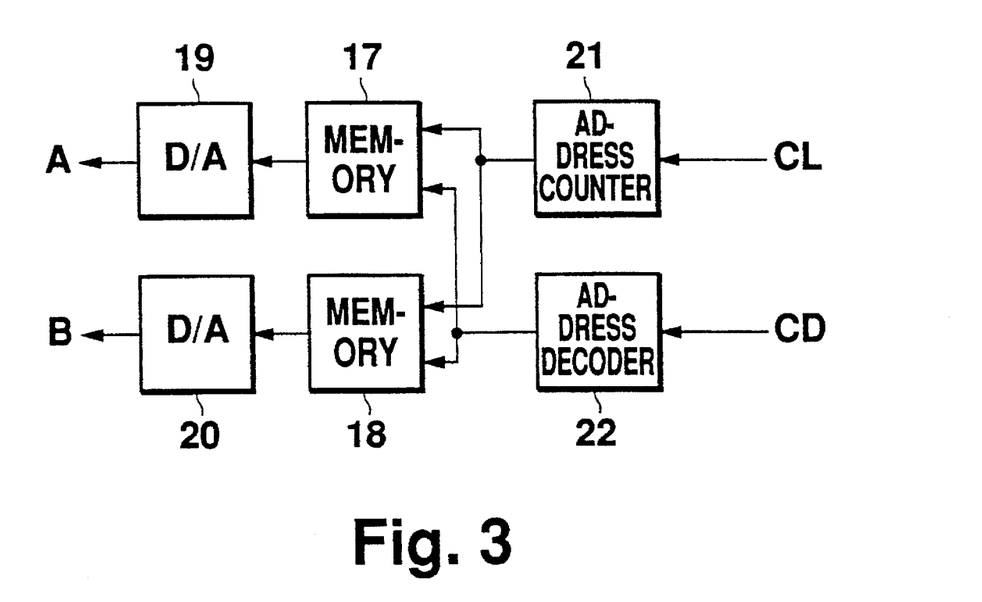
FIG. 3 is a block diagram showing a compositional example of a base band generator.

FIG. 3 is a compositional example of the base band generator. In FIG. 3, the numerals designate respectively: 17 and 18, memories containing sampling values of output waveform (e.g. two outputs of a sine wave and a cosine wave) of a same phase component and cross component respectively being written therein; 19 and 20, D/A converters for converting the digital data from the memories 17 and 18 into analog voltages; 21, an address counter for determining a reading address in accordance with a clock signal CL from the clock generator; 22, an address decoder for determining which range of the memories 17 and 18 is to be read out in accordance with a controlling signal CD from the controlling circuit 11.

The controlling signal CD changes the reading-out portion of the memories 17 and 18 (the step for incrementing the reading address is changed), so that the frequency of the signal to be output therefrom will be changed. The thus read-out sine wave data are then converted into analog signals by the D/A converters 19 and 20. In this manner, sine wave signals (two signals with phase difference of 90 degrees) can be obtained in accordance with the reading out data from the memories 17 and 18.

In operation, the output fvco of the voltage controlled oscillator 5 can be expressed as follows:

$$fvco = Nfr$$

where fvco: output from the voltage controlled oscillator;

fr: frequency of a reference frequency signal being an output from the reference frequency divider 14;

N(a positive integer): a frequency dividing ratio of the variable frequency dividing circuit 9.

As a result, it is possible to change the output frequency fout in the changing step fr by changing the frequency dividing ratio N in the variable frequency dividing circuit 9 as in the conventional system.

In this embodiment, the changing step fs of the output signal frequency four is set to 1/L (L: a positive integer) of the reference frequency fr. Namely, $$fr = L * fs$$

On the other hand, the output frequency fout is $$fout = M * fs$$

where M is a positive integer.

If the oscillating frequency fvco and the output frequency fout of the voltage controlled oscillator 5 can be expressed as follows:

$$f\,vco = fout$$

it will become $$N = M/L$$

The frequency dividing ratio N must be, however, an integer so that $$N = [M/L] \text{ ([ ] stands for an integer)}$$

There exists a difference k between M and N*L, so that $$k = M - N*L$$

$N*L=M-k$

As a result, the output frequency fvco of the voltage controlling oscillator 5 will be $$fvco = N*fr$$
$$= N*Lfs = M*fs - k*fs = fout - k*fs$$

where k is a positive integer.

Accordingly, the frequency fout of the output signal will be $$fout=Nfr+kfs$$

In this manner, the PLL synthesizer 50 outputs a frequency in accordance with the value of N in the changing step fr, and requires another means operating in k*fs for operating in the changing step fs.

In the present embodiment, the base band generator 2 operates with k*fs.

The memory 17 of the base band generator 2 contains data which have been sampled with a sampling frequency fc of the sine wave signals of the frequency fs written therein, while the memory 18 contains sampling data of sine wave signals having a phase different therefrom by 90 degrees.

The data in the memories 17 and 18 are read out with a frequency fc of the clock signals CL generated by the clock generator 3 in accordance with the controlling signals CD from the controlling circuit 11 and are then converted into analog signals by the D/A converter which outputs the following sine wave signals:

$$f\,BBG=fs$$

On the other hand, the data in the memories 17 and 18 are sequentially read out in k address units and are then converted into analog signals by the D/A converters 19 and 20 with the following frequency:

$$f\,BBG=k*fs$$

so as to provide sine wave signals A and B with 90 degrees of phase difference from each other. For example, A and B can be represented as cos (2 f BBG t) and sin (2 f BBG t) respectively. The value of f BBG must not exceed fc/2 for providing sine waves as an output from the memories 17 and 18.

The modulating signal s (t) as an output of the quadrature modulator in FIG. 2 can be represented as follows:

$$s(t)=I(t)*\cos(\omega t)-Q(t)*\sin(\omega t) \quad (1)$$

where

I (t): the input signal A;

Q (t) : the input signal B;

cos (ωt): input signal C;

sin (ωt): input signal D

The input signals A and B input to the quadrature modulator 1 become outputs of the base band generator 2 to be expressed respectively:

$$I(t)=\cos(2\pi f\,BBG\,t) \text{ and } Q=(t)=\sin(2\pi f\,BBG\,t).$$

In the signals C and D, since ω=2ω fvco, they are represented as cos (2π fvco) and sin (2π fvco) respectively.

Namely, in the formula (1), since I (t)=cos (2π f BBG t), Q=(t)=sin (2π f BBG t), and ω=2π fvco, the output from the quadrature modulator 1 will be expressed as follows:

$$\begin{aligned}s(t) &= \cos(2\pi f\,BBG\,t)*\cos(2\pi fvco) - \\ &\quad \sin(2\pi f\,BBG\,t)*\sin(2\pi fvoc) \\ &= \cos\{2\pi(fvoc+f\,BBG)t\}\end{aligned} \quad (2)$$

Since the output signal f out is a sine wave signal expressed as f out=fvco+f BBG, it can be understood that the desired frequency signal can be obtained with a changing step fs. Namely, as earlier mentioned, since f BBG=k*fs, the output signal can be changed in fs units by changing the value k for reading out data from the memories 17 and 18 (the reading operation is carried out with k address unit).

At this time, the reference frequency fr of the PLL synthesizer can be increased up to fc/2 which is the maximum value of the output frequency f BBG of the base band generator 2. Namely, up to this frequency the requirement is met by the change of the value k of k*fs, by setting the value fr to be not exceeding this frequency. As a result, the cut-off frequency of the filter 6 of the PLL synthesizer can be higher than fs, so as to shorten the switching time of the PLL synthesizer.

Meanwhile, the base band generator 2 digitally produces signals from the data read out from the memories 17 and 18, so that its switching operation can be carried out instantaneously.

In this manner, according to this embodiment, the output signal frequency four can be changed with the frequency fr as a changing step by changing the frequency dividing ratio N of the variable frequency divider 9 in accordance with the command from the controlling circuit 11. The output signal frequency fout can be changed with the frequency fs as a changing step by changing the value k representing the step of the read out address of the base band generator 2.

For example, if fs=25 kHz, fr=100 kHz, then L=4. Therefore, an output frequency fout 800.025 MHz can be obtained by setting the values M, k and N to 32001, 1, and 8000 respectively.

As a result, the following values are obtained:

$$fvco=N*fr=800 \text{ MHz},$$

$$fout=800+0.025=800.025 \text{ MHz}$$

Second Embodiment

Figure 4:
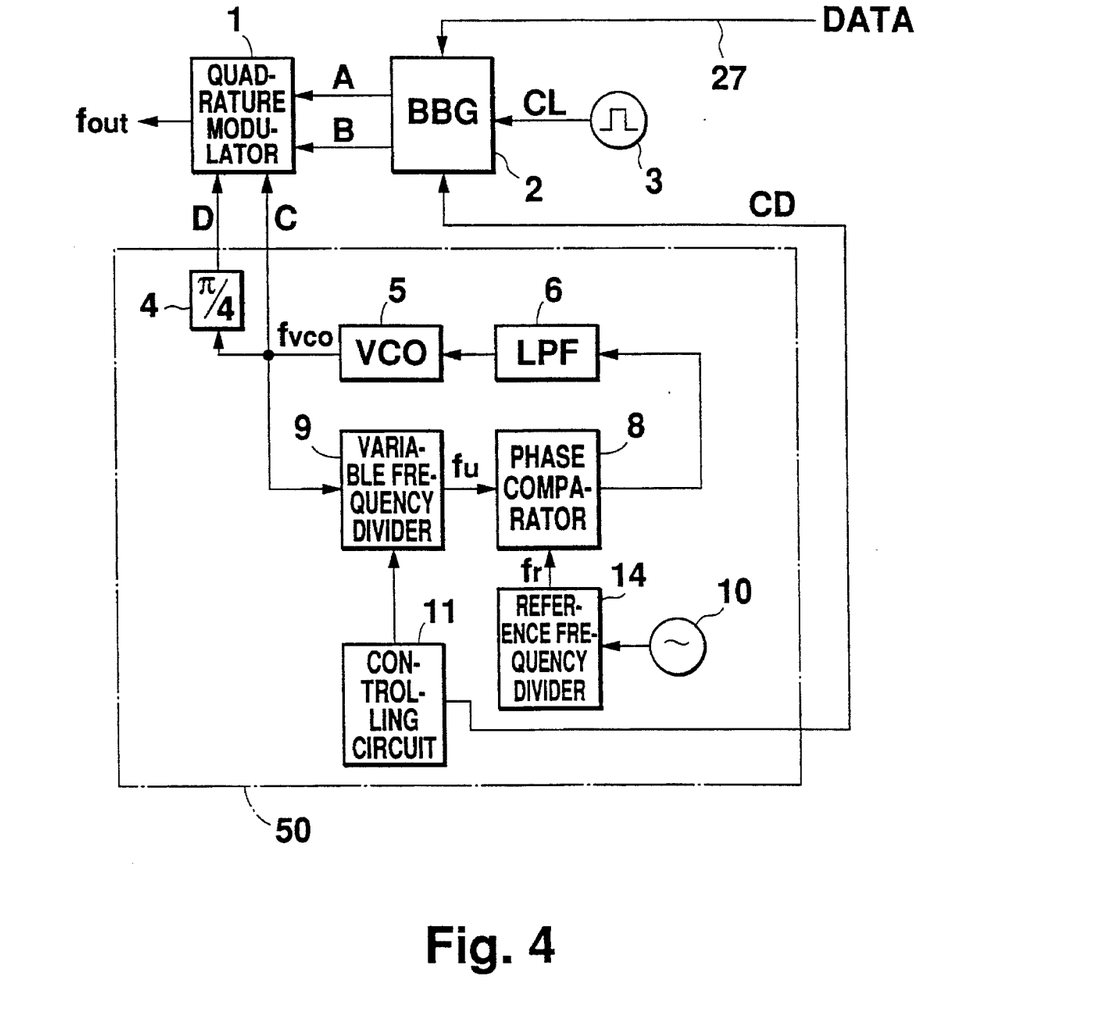
FIG. 4 is a block diagram showing a frequency synthesizer according to a second embodiment of this invention.

FIG. 4 is a block diagram showing a composition of a second embodiment according to this invention. The difference from the first embodiment lies in that a signal DATA is input to the base band generator 2. The base band generator in this embodiment outputs two cross signals A and B having been phase-modulated by the signal DATA.

Figure 5:
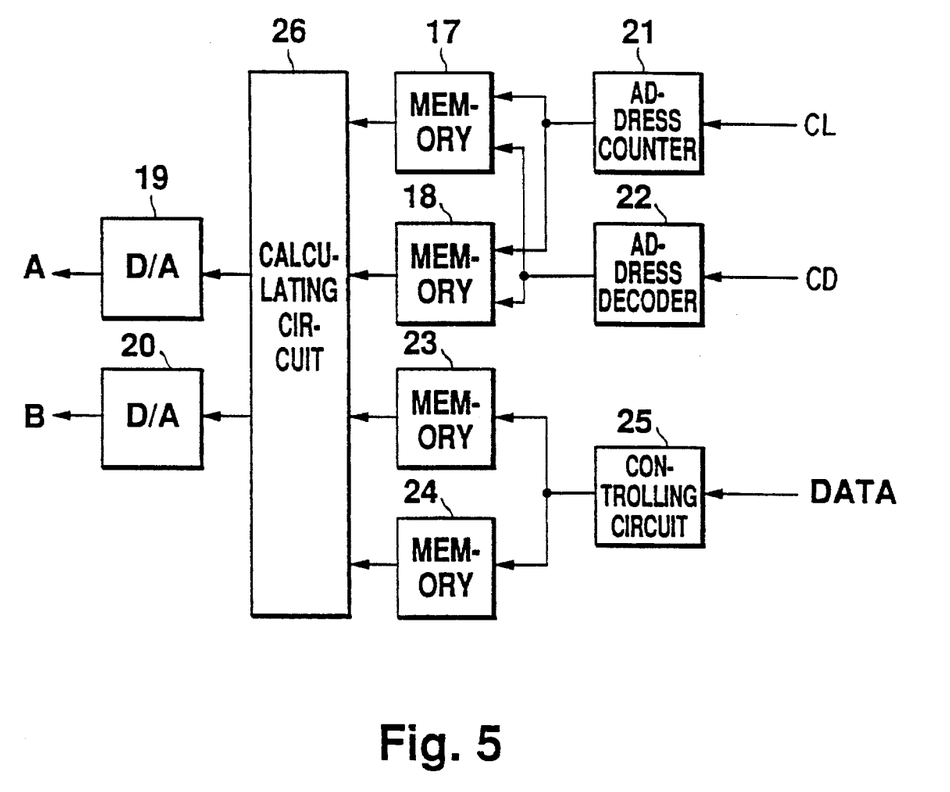
FIG. 5 is a block diagram showing a composition of a base band generator for use in the frequency synthesizer in the second embodiment of this invention.

FIG. 5 shows a composition of the base band generator in this embodiment. In FIG. 5, the numerals designate respectively: 23 and 24, memories containing sampling values of the same phase component and cross component of a base band signal waveform for the phase modulation respectively being written therein; 25, a controlling circuit for inputting the signal DATA being digital data for the phase modulation; 26, a digital calculating circuit for calculating the output waveform from the data from the memories 17, 18 and 23, 24.

In operation, waveform data of the same phase component I'(t) and cross component Q'(t) of the base band signal in accordance with the digital data input are output from the memories 23 and 24 in FIG. 5. The controlling circuit 25 determines from which portion of the memories 23 and 24 to output data in accordance with the input DATA. Namely, the phase of the base band signal is changed by determining the position of the reading start. For example, it is possible to set two types of 0 degrees, and 180 degrees, or four types of 90 degrees each.

On the other hand, the memories 17 and 18 output waveform data of the same phase and cross components of the sine wave signal of the frequency f BBG as explained in the first embodiment.

The calculating circuit 26 calculates the base band signal waveform data in accordance with the synthesizer output frequency from those four-system waveform data, so that two base band signals of the frequency f BBG are output from the D/A converters 19 and 20.

The calculation at this time can be expressed as follows:

$$I(t)=I'(t)*\cos(2\pi fBBG\,t) - Q'(t)*\sin(2\pi fBBG\,t) \quad (3)$$

$$Q(t)=I'(t)*\sin(2\pi fBBG\,t) + Q'(t)*\cos(2\pi fBBG\,t) \quad (4)$$

where

I(t): output signal A

Q(t): output signal B

When the output of the base band generator 2 is input to the quadrature modulator 1 as signals A and B, then the output of the quadrature modulator 1 will be as follows:

$$s(t)=I'(t)*\cos\{2(fBBG+fVCO)t\} - Q'(t)*\sin\{2(fBBG+fVCO)t\} \quad (5)$$

so that a phase modulating output can be provided in accordance with digital data DATA of a desired frequency.

Third Embodiment

Figure 6:
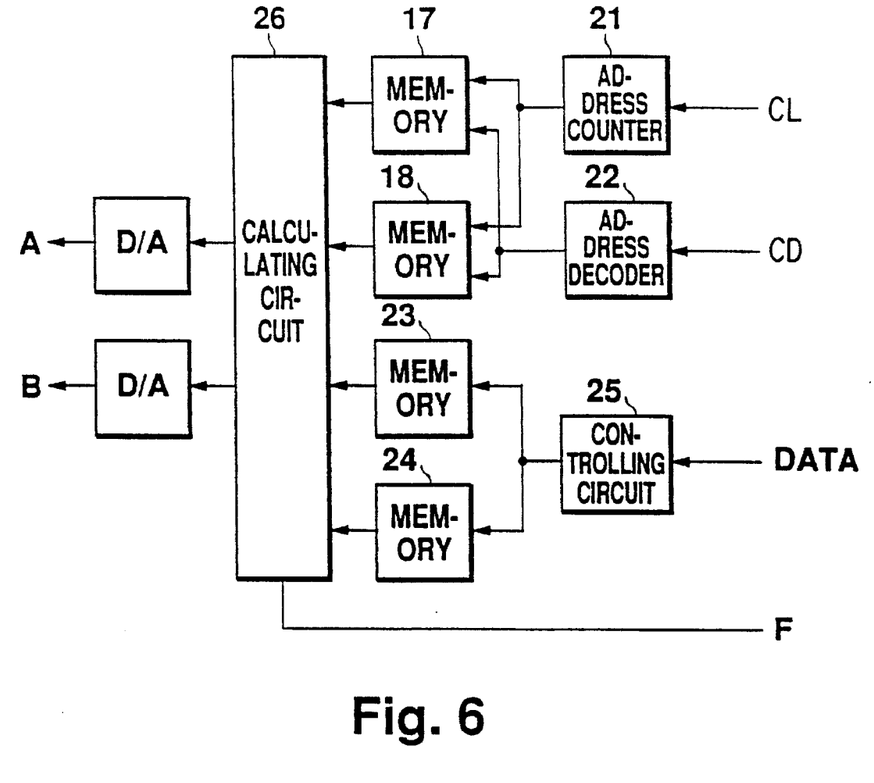
FIG. 6 is a block diagram showing a composition of a base band generator for use in the frequency synthesizer according to a third embodiment of this invention.

FIG. 6 shows a composition of a base band generator according to a third embodiment of this invention. In this embodiment, a polarity switching signal F is input to the calculating circuit 26 for changing the polarity of the calculation.

For example, in the formulas (3) and (4), if the polarity of Q'(t) is inverted, then:

$$I(t)=I'(t)*\cos(2\pi fBBG\,t) + Q'(t)*\sin(2\pi =fBBG\,t) \quad (6)$$

$$Q(t)=I'(t)*\sin(2\pi fBBG\,t) - Q'(t)*\cos(2\pi fBBG\,t) \quad (7)$$

If this base band generator is used as the base band generator 2 of the frequency synthesizer in FIG. 1 or 4, then the output of the quadrature modulator will be as follows:

$$s(t)=I'(t)*\cos\{2\pi(fVCO-fBBG)t\} - Q'(t)*\sin(2\pi(fVCO-fBBG)t) \quad (8)$$

Namely, by changing the polarity of Q'(t) with an external polarity switching signal F at the time of calculation, it is possible to provide a signal with a frequency of f VCO+f BBG in the case of positive, while f VCO−f BBG in the case of negative.

Accordingly, it is possible to provide a frequency of ±kfs for the frequency Nfr integer-multiple of the reference frequency fr of the PLL synthesizer. Therefore, the maximum value of fBBG can be one half of the fr, so that the sampling frequency fc of the base band generator 2 can be its duplicate, i.e. fr.

Fourth Embodiment

Figure 7:
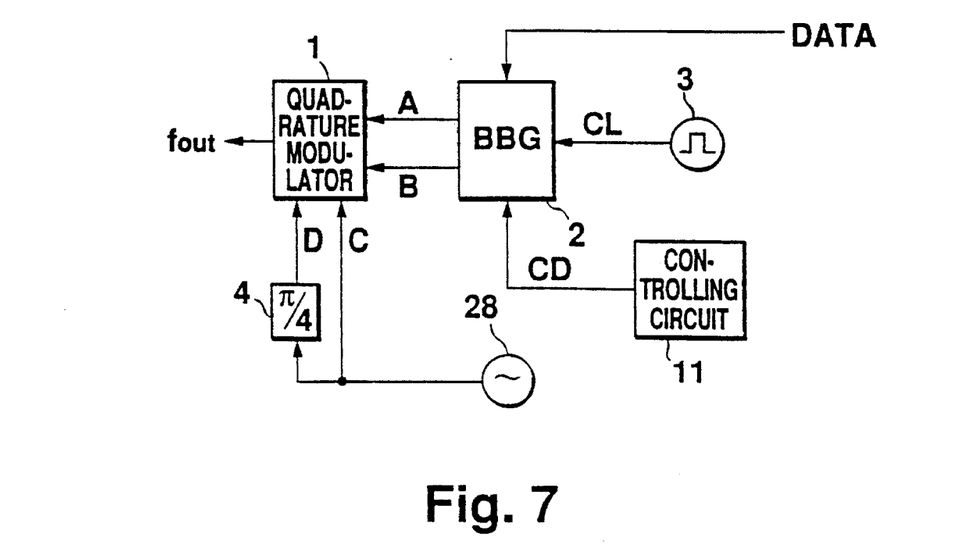
FIG. 7 is a block diagram showing a frequency synthesizer according to a third embodiment of this invention.

FIG. 7 shows a composition according to a fourth embodiment of this invention. In FIG. 4, the numerals designate respectively: 28, a fixed oscillator for oscillating at a fixed frequency. One output of this fixed oscillator 28 is supplied to the quadrature modulator 1 directly as a signal C, while the other output is supplied as a signal D having been phase-shifted by 90 degrees from signal.

In operation, the oscillating frequency of the fixed oscillator 28 in FIG. 7 is designated as fx.

Assuming that the output C of the fixed oscillator 28 and the output D of the phase shifter 4 are cos (2π fxt) and sin (2 fxt) respectively, and that the output of the base band generator is represented by the formulas (3) and (4) in the embodiment, the output s(t) of the quadrature modulator would be expressed as follows:

$$s(t)=I'(t)*\cos\{2\pi(fBBG+fx)t\} - Q'(t)*\sin\{2\pi(fBBG+fx)t\} \quad (9)$$

Accordingly, in this embodiment it is possible to change the output frequency fout by varying the frequency f BBG of the output of the base band generator 2. Namely, the output frequency can be changed by changing k in step of fs, because of the fact that f BBG=k*fs.

Other Embodiments

In the first embodiment, the output frequency fBBG of the base band generator has been set to a range from zero to a value smaller than the frequency step fr of the PLL synthesizer, but it is also possible to synthesize higher frequencies at each desired frequency step fs.

Further in the aforementioned embodiments the output frequency fBBG of the base band generator 2 has been set by the controlling signal D, but it is also possible to determine that by changing the output frequency CL of the clock generator 3.

In addition, it is possible to provide a frequency synthesizer which is capable of changing the frequency step by providing a plurality of selectable changing steps fs of the output frequency fBBG of the base band generator 2 and selecting the frequency step fr of the PLL synthesizer to become its common multiple (an integer-multiple number of all fs).

In the third embodiment, it has been constructed so that the polarity of the calculation is changed in the base band generator, but it is also possible to construct this embodiment so as to change the polarity of the adder 15 of the quadrature modulator 1 in the case of not performing the phase modulation by the digital data DATA. In other words, in the aforementioned embodiment the adder 15 carries out subtraction of the input signals, but it can also be constructed to selectively perform addition or subtraction in accordance with the switching signal F.

Furthermore, in the third embodiment, the polarity of the calculation has been changed. It is also possible, however, to construct it such that predetermined data having been read out from the memories 17, 18, 23 and 24 (e.g. read-out data from the memory 24) are inverted, or that the inverted data are written in a separate area of the memory and the reading address is changed.

What is claimed is:

1. A frequency synthesizer for generating signals of a variety of frequencies, comprising:

a signal generator for outputting two signals of a predetermined frequency and of phases different from each other by 90 degrees;

a base band generator for digitally generating two shifting signals of a frequency designated by a command and of phases different from each other by 90 degrees; and a quadrature modulator for performing quadrature modulation with two output signals from said signal generator and two shifting signals from the base band generator, in order to output a signal shifted by just the frequency of the shifting signal from that of the output signal from the signal generator;

wherein said signal generator comprises:

a reference oscillator for oscillating with a constant frequency;

a reference frequency divider for dividing the output frequency of the reference oscillator to output a reference frequency;

a voltage controlled oscillator for outputting a frequency corresponding to a frequency controlling voltage;

a variable frequency divider for dividing the output of the voltage controlled oscillator in accordance with a designated dividing ratio;

a phase comparator for comparing the output from said reference frequency divider to the output from said variable frequency divider;

a filter for smoothing the output from said phase comparator to supply the frequency controlling voltage to said voltage controlled oscillator; and a phase shifter for shifting the phase of the output from said voltage controlled oscillator by 90 degrees.

2. A frequency synthesizer according to claim 1, wherein:

said quadrature modulator can change its polarity for performing either an addition or a subtraction at the time of quadrature modulation calculation.

3. A frequency synthesizer for generating signals of a variety of frequencies, comprising:

a signal generator for outputting two signals of a predetermined frequency and of phases different from each other by 90 degrees;

a base band generator for digitally generating two shifting signals of a frequency designated by a command and of phases different from each other by 90 degrees; and a quadrature modulator for performing quadrature modulation with two output signals from said signal generator and two shifting signals from the base band generator, in order to output a signal shifted by just the frequency of the shifting signal from that of the output signal from the signal generator;

wherein said base band generator sequentially reads out the digital data written in a built-in-memory in accordance with a clock supplied from an outside clock oscillator and converts the read out digital data into analog signals using a D/A converter in order to generate the shifting signals; and wherein the read out address of said digital data read out from the built-in-memory is changed by a step k (where k is a variable integer) thereby allowing the frequencies of the two shifting signals to be changed by changing the value of the step k without changing the frequency of the clock supplied from the outside oscillator.

4. A frequency synthesizer according to claim 3, wherein said signal generator generates signals of a constant frequency.

5. A frequency synthesizer according to claim 3, wherein:

said quadrature modulator can change its polarity for performing either an addition or a subtraction at the time of quadrature modulation calculation.

6. A frequency synthesizer for generating signals of a variety of frequencies, comprising:

a signal generator for outputting two signals of a predetermined frequency and of phases different from each other by 90 degrees;

a base band generator for digitally generating two shifting signals of a frequency designated by a command and of phases different from each other by 90 degrees; and a quadrature modulator for performing quadrature modulation with two output signals from said signal generator and two shifting signals from the base band generator, in order to output a signal shifted by just the frequency of the shifting signal from that of the output signal from the signal generator;

wherein said base band generator comprises:

a phase modulating data input terminal for phase-modulating and outputting the shifting signals on the basis of the input phase modulating data;

two memories for being read in accordance with a clock from an outside clock oscillator to output two signals of phases different from each other by 90 degrees;

two memories for being read in accordance with the data input from the phase modulating data input terminal to output two phase modulation signals of phases different from each other by 90 degrees;

a calculating section for performing a cross modulating calculation on the basis of the signals having been read out from aforementioned four memories; and a D/A converter for converting the output from said calculating section into analog signals.

7. A frequency synthesizer according to claim 6, wherein said base band generator further includes a polarity-changing signal terminal for changing the polarity of addition/subtraction at the time of the cross modulating calculation in the calculating section.

* * * * *